(12) United States Patent
Pawlowski et al.

(10) Patent No.: US 6,277,750 B1
(45) Date of Patent: Aug. 21, 2001

(54) COMPOSITION FOR BOTTOM REFLECTION PREVENTIVE FILM AND NOVEL POLYMERIC DYE FOR USE IN THE SAME

(75) Inventors: Georg Pawlowski, Shizuoka (JP); Munirathna Padmanaban, Somerville, NJ (US); Wen-Bing Kang, Shizuoka (JP); Hatsuyuki Tanaka, Shizuoka (JP); Ken Kimura, Shizuoka (JP); Yoshinori Nishiwaki, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/508,624
(22) PCT Filed: Jun. 23, 1999
(86) PCT No.: PCT/JP99/03333
 § 371 Date: Jun. 27, 2000
 § 102(e) Date: Jun. 27, 2000
(87) PCT Pub. No.: WO00/03303
 PCT Pub. Date: Jan. 20, 2000

(30) Foreign Application Priority Data

Jul. 10, 1998 (JP) .................................................. 10-195174

(51) Int. Cl.$^7$ .................................................. H01L 21/00
(52) U.S. Cl. .......................... 438/689; 216/49; 430/313; 438/710; 438/725
(58) Field of Search ................................. 438/636, 689, 438/707, 708, 710, 725; 216/41, 49, 50; 430/313, 314, 323, 332

(56) References Cited

FOREIGN PATENT DOCUMENTS

| | | | |
|---|---|---|---|
| 51-20298 | * | 2/1976 | (JP) . |
| 60-255805 | * | 12/1985 | (JP) . |
| 61-42507 | * | 3/1986 | (JP) . |
| 63-172711 | * | 7/1988 | (JP) . |
| 06075378 | * | 3/1994 | (JP) . |
| 06118631 | * | 4/1994 | (JP) . |
| 06192326 | * | 7/1994 | (JP) . |
| 10221855 | * | 8/1998 | (JP) . |
| 10330432 | * | 12/1998 | (JP) . |
| 11038622 | * | 2/1999 | (JP) . |

* cited by examiner

Primary Examiner—William Powell
(74) Attorney, Agent, or Firm—Sangya Jain

(57) ABSTRACT

As a bottom anti-reflective coating material for use in photolithography, polymer dyes represented by following general formula are used. The polymer dyes are able to form a bottom anti-reflective coating having good film formation properties, good absorption properties at exposure wavelength, good step coverage, non-intermixing with photoresist and high etch rate.

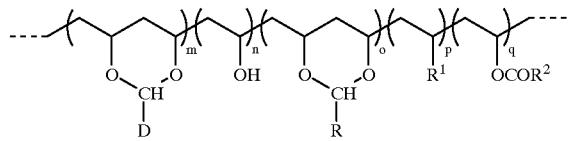

wherein
R represents H or a substituted or non-substituted alkyl, cycloalkyl, or aryl group, $R^1$ represents a substituted or non-substituted alkyl or aryl, or a —$COOR^3$ group in which $R^3$ represents an alkyl group, $R^2$ represents a substituted or non-substituted alkyl, cycloalkyl, or aryl group, D is an organic chromophore which absorbs at the exposure wavelength (150–450 nm) and represents a substituted or non-substituted aryl, condensed aryl, or heteroaryl group, m and o are any integer above zero, and n, p and q are any integer including zero.

18 Claims, No Drawings

COMPOSITION FOR BOTTOM REFLECTION PREVENTIVE FILM AND NOVEL POLYMERIC DYE FOR USE IN THE SAME

TECHNICAL FIELD

This invention relates to a novel composition for a bottom anti-reflective coating composition, a method of forming a bottom anti-reflective coating between a substrate and a photoresist layer using the bottom anti-reflective coating composition and manufacturing integrated circuits utilizing a photolithography method, and novel polymer dyes. More particularly this invention relates to a composition for a bottom anti-reflective coating comprising at least a solvent and a novel polymer dye having recurrent cyclic acetal units, and a method of forming a bottom anti-reflective coating by using the composition and manufacturing integrated circuits by utilizing a photolithography method, novel polymer dyes, and a method of producing thereof.

BACKGROUND ART

In manufacturing integrated circuits and active elements and interconnecting structures within microelectronic devices, a photolithography technique using photoresist compositions is utilized. In general the manufacturing of the integrated circuits or microelectronic devices are conducted as followed. That is, first, a photoresist material dissolved in a solvent is applied on a substrate such as silicon wafer by spin coating. The substrate coated with resist is then baked at elevated temperatures to evaporate any solvent in the photoresist composition and to form a thin photoresist layer with good adhesion to the substrate. The thin photoresist layer on the wafer was subjected to an imagewise exposure to radiation in the range of 150 to 450 nm wavelength, such as visible or ultraviolet (UV) rays. The imagewise exposure may also be conducted by electron beam or X-ray radiation in place of such visible or UV rays. In the exposed areas of the photoresist layer the chemical transformation arises by the exposure. After the imagewise exposure, the substrate with an imagewise exposed resist layer was subjected to developing process using an alkaline developer to dissolved out either the unexposed (negative-working resist) or exposed (positive-working resist) areas. The opened areas on the substrate formed by dissolving out the resist are subjected to additional unselective processing steps to manufacture final integrated circuits or electronic devices.

In manufacturing integrated circuits and the like, the high degree of integration has been intended and, in recent years, in order to attain a higher degree of integration techniques for still more decreasing feature sizes are required. Therefore lithographic techniques using conventional near UV, such as g-line (436 nm) and i-line (365 nm) shift to imaging processes using radiation of shorter wavelength, such as middle UV (350–280 nm), or deep UV (280–150 nm). The latter especially employs KrF (248 nm) or ArF (1 93 nm) excimer laser radiation. Excimer laser radiation sources emit monochromatic radiation. Highly sensitive, excimer laser compatible chemically amplified, positive- or negative-working deep UV photoresist compositions offering excellent lithographic performance and high resolution capability have become available recently. Due to their chemical compositions and their image formation mechanisms, state-of-the-art chemically amplified photoresist compositions are usually transparent at the exposure wavelength, and do not exhibit a pronounced sensitivity owing to poisoning effects induced by base contaminants present at the photoresist-substrate or photoresist-air interfaces, respectively. While appropriate deep-UV exposure tools in combination with the high performing photoresists are capable of patterning structural elements with dimensions below quarter micron design rules, tendency of arising image distortions and displacements due to some optical effects become conspicuous in such high resolution image. Therefor the method of forming resist images not affected by such optical effects and having good reproducibility are strongly required.

One of the problems caused by such optical effects is "standing wave" formation which is well known in the art and arise from substrate reflectivity and thin film interference effects of the monochromatic radiation. Another problem is "reflective notching" known in the art due to light reflection effects resulting from highly reflective topographic substrates. In single layer resist processes it is difficult to conduct the linewidth uniformity control due to the reflective notching. Certain reflective topographical features may scatter light through the photoresist film, leading to linewidth variations, or in other case, resist loss. Such problems are extensively documented in the literature, e.g. (i) M. Horn, Solid State Technol., 1991(11), p. 57 (1991), (ii) T. Brunner, Proc. SPIE 1466, p. 297 (1991), or (iii) M. Bolsen et al., Solid State Technol., 1986(2), p. 83, (1986).

Thin film interference generally results in changes of linewidth by variations of the substantial light intensity in the resist film as the thickness of the resist changes. These linewidth variations are proportional to the swing ratio (S) defined by following equation (1) and must be minimized for better linewidth control.

$$S = 4(R_1 R_2)^{1/2} e^{-\alpha D} \tag{1}$$

Wherein $R_1$ is the reflectivity at the resist-air interface, $R_2$ is the reflectivity of the resist-substrate interface, $\alpha$ is the resist optical absorption coefficient, and D represents the resist film thickness.

One of lithographic techniques to overcome the above-mentioned problems during pattern formation on reflective topography is addition of radiation absorbing dyes to the photoresists as described in U.S. Pat. Nos. 4,575,480 or 4,882,260. This corresponds to an increase of the optical absorption coefficient a in equation (1) above. When a dye is added to the photoresist to form a radiation sensitive film having high optical density at the exposure wavelength, drawbacks such as loss of resist sensitivity, resolution and depth-of-focus capability, contrast deterioration, and profile degradation are encountered. In addition, difficulties during subsequent hardening processes, thinning of the resists in alkaline developers and sublimation of the dye during baking of the films may be observed.

Top surface imaging (TS1) processes, or multi layer resist arrangements (MLR) as described in U.S. Pat. No. 4,370, 405 may help prevent the problems associated with reflectivity. However, such methods require complex processes and are not only difficult to control the processes but also expensive and therefore not preferred. Single layer resist (SLR) processes dominate semiconductor manufacturing because of their simplicity and cost-effectiveness.

The use of either top or bottom anti-reflective coatings in photolithography is a much simpler and effective approach to diminish the problems that arise from thin film interference, corresponding to either a decrease of $R_1$ or $R_2$ and thereby reducing the swing ratio S.

The most effective means to eliminate the thin film interference is to reduce the through the use of so-called bottom anti-reflective coatings (BARC). These coatings have the property of absorbing the light which passes through the photoresist and not reflecting it back. The bottom anti-reflective coating composition is applied as a thin film on the substrate prior to coating with the photoresist composition. The resist is then applied on the bottom anti-reflective coating, exposed and developed. The anti-reflective coating in the resist removed areas is then etched, for example in an oxygen plasma, and the resist pattern is thus transferred to the substrate allowing for further processing steps for forming active elements, interconnecting structures etc. The etch rate of the anti-reflective coating composition is of major importance and should be relatively higher than that of the photoresist, so that it is etched without significant loss of the photoresist film during the etch process.

Bottom anti-reflective coatings are typically divided into two types, namely inorganic and organic bottom anti-reflective coating types.

Inorganic types include stacks of dielectric anti-reflective coatings such as TiN, TiON, TiW and spin-on glasses useful in a thickness range of below 300 Å. Examples are described by (i) C. Noelscher et al., Proc. SPIE 1086, p. 242 (1989), (ii) K. Bather et al., Thin Solid Films, 200, p. 93 (1991), or (iii) G. Czech et al., Microelectr. Engin., 21, p. 51 (1993). Although inorganic dielectric anti-reflective coatings effectively reduce thin film interference effects, they require complicated and precise control of the film thickness, film uniformity, special deposition equipment, complex adhesion promotion techniques prior to resist coating, separate dry etching pattern transfer step, and are usually difficult to remove.

Improved linewidth and standing wave control can also be attained by use of organic bottom anti-reflective coating as same as inorganic type. As organic bottom anti-reflective coatings it is known ones formulated by adding dyes which absorb at the exposure wavelength to a polymer film, as described by C. H. Ting et al., Proc. SPIE 469, p. 24 (1984), or W. Ishii et al., Proc. SPIE 631, p. 295 (1985). Problems of the anti-reflective coatings produced as described above include (1) separation of dye and polymer during spin coating, drying, or baking, (2) sublimation of the dye during the subsequent hard-bake step, (3) dye stripping into resist solvents, (4) thermal diffusion into the resist upon the baking process and (5) interfacial layer formation. These phenomena may cause severe degradation of lithographic properties especially when combined with chemically amplified photoresists and therefore the method of using dye blended bottom anti-reflective coatings are not preferred. Especially problematic is the sublimation issue, as not only the absorption properties of the bottom anti-reflective coating are deteriorated, but also contamination of the expensive equipment must be anticipated, causing process problems due to increased particle concentrations at a later stage.

As an alternative, organic bottom anti-reflective coatings containing radiation absorbing pigments have been suggested (EP-A1 744662). Such bottom anti-reflective coatings may produce a large number of insoluble particles during device processing and thereby reduce yield considerably.

Direct chemical attachment of dyes to a film forming polymer is another option (US patent 5,525247). The materials disclosed therein are usually casted from hazardous organic solvents, such as cyclohexanone or cyclopentanone. M. Fahey et al., Proc. SPIE 2195, p. 422 (1994) describe amino group-containing dyes reacted with the anhydride groups of poly(vinylmethylether-co-maleic anhydride). One problem connected with these types of bottom anti-reflective coating compositions is that the reaction between the amine and the polymeric anhydride groups does not proceed quantitatively thus resulting in the presence of free amines (EP-A1 583,205, p. 5, lines 17–20). The unreacted amine causes poisoning of the resist at the bottom anti-reflective coating-resist interface especially when base sensitive chemically amplified resist compositions are employed resulting in resist foot formation due to incomplete dissolution of the exposed resist bottom layer upon development. The free dye molecules may also sublime during the baking process, deposit on the fabrication instruments and cause contamination problems as well as health hazard to the workers. One more disadvantage of these specific composition is that imide compounds formed upon the reaction between the amine and the anhydride groups are poor in their solubility and require polar solvents for their processing not used normally in photoresist formulations. From the processing standpoint, it would be ideal to use the same solvent for photoresist and for bottom anti-reflective coating. Furthermore, water which is formed as the by-product of the imidization reaction may cause coating defects (pinholes) during film formation.

Another system which Fahey et al. propose in the above mentioned publication is based on materials composed from copolymers of methyl methacrylate and 9-methylanthracene methacrylate. However, formulations based on these copolymers usually show footing due to the diffusion of photo generated acid into the bottom anti-reflective coating film as well as intermixing of the resist and the bottom anti-reflective coating film thus limiting their practical use. The copolymers are also insoluble in preferred photoresist solvents such as propylene glycol monomethyl ether acetate (PGMEA) or ethyl lactate (EL).

U.S. Pat. Nos. 5,234,990 and 5,578,676 describe polysulfone and polyurea resins which possess inherent light absorbing properties at deep ultraviolet wavelengths. However, these condensation products have comparatively poor film forming properties and therefore exhibit poor step-coverage on topographic substrates, resulting in a problem of image transfer to the substrate. In addition, it has been found that these materials exhibit a high degree of crystallinity and tend to form cracks probably due to their high Tg and rigid structures. Initially, a bottom anti-reflective coating should be soft to achieve good step coverage properties upon coating and in addition should have the ability to crosslink and harden after baking to prevent intermixing of the photoresist with the bottom anti-reflective coating layer as well as diffusion of the photo generated acid.

U.S. Pat. No. 5,554,485 and EP-A1 698823 describe poly(arylether) or poly(arylketone) polymers respectively. These polymers have a rather high concentration of aromatic units and therefore their etch rates are rather low. That is same for the polyvinylnaphthalene derivatives disclosed in U.S. Pat. No. 5,482,817.

EP-A1 542008 describes the use of phenolic type resin binders and melamine type crosslinking agents in combination with either thermal, or photo acid generators to harden the bottom anti-reflective coating film after coating. Such compositions are poor in their storage stability due to the presence of the crosslinking agents and photo acid generators resulting in high film defect yields. In addition, their etch rate is very low due to the presence of rather large amounts of aromatic functional groups.

Japanese Laid-opened Patent Publication No. H10-221855 discloses an anti-reflective coating material composition containing a high molecular compound in which choromophores having 10,000 or more of molar extinction coefficient for either 365 nm, 248 nm or 193 nm wavelength radiation are linked to at least a part of alcohol moieties of recurrent vinyl alcohol units in main chain and a method of producing resist patterns. However introduction of such bulky polycyclic aromatic group alone into a high molecular compound containing recurrent vinyl alcohol such as polyvinyl alcohol by acetalization reaction requires elevated temperature and long time reaction. In addition it is difficult to attain high reaction percentage. The publication disclose that expected yield is attained when the reaction was conducted in dioxane at 100° C. for 40 hours. However the organic chromophore groups are easy to decompose under such reaction conditions and it is necessary to moderate the reaction conditions.

In summary, a superior bottom anti-reflective coating material should satisfy the following requirements:

a) good film forming property
b) high absorption at the applied exposure wavelength
c) no intermixing with the photoresist
d) high etch rate compared with the photoresist
e) good step coverage on topography
f) practical storage stability
g) compatibility with and solubility in photoresist and edge-bead rinse (EBR) solvents
h) adaptability to several commercial resists
i) ease of production and high yield.

The object of the present invention is to provide an anti-reflective coating composition satisfying above preferable properties, a method of manufacturing integrated circuits using the composition, novel polymer dyes and a method of preparing thereof.

Definitely, the first objective of the present invention is to provide a bottom anti-reflective coating composition which absorbs radiation in the wavelength range of 150–450 nm thus eliminating problems associated with light reflected from the substrate and topography during pattern formation.

The second objective of the present invention is to provide a bottom anti-reflective coating composition having improved adhesion to integrated circuit or micro-electronic substrates, very good coating uniformity and showing no particle formation.

The third objective of the present invention is to provide a bottom anti-reflective coating composition with a superior etch rate than current available bottom anti-reflective coatings, having improved compatibility with the existing chemically amplified photoresists, and generating neither undercut nor footing.

The fourth objective of the present invention is to provide novel polymeric dyes having cyclic acetal moieties and applicable for a bottom anti-reflective coating composition as well as producible easily and in high yield and a method of preparing thereof.

The fifth objective of the present invention is to provide bottom anti-reflective coating compositions comprising of polymeric dyes having cyclic acetal moieties, together with, if necessary, crosslinking agents and other additives such as photo acid generators, plasticizers or surfactants.

The sixth objective of the present invention is to provide novel polymer and copolymer materials producible easily and in high yield, and capable of curing (crosslinking) at the baking temperatures of the resulting bottom anti-reflective coating to harden the bottom anti-reflective coating thus providing a barrier for photoresist solvent or component penetration and thereby preventing foot formation caused by either intermixing or acid diffusion.

The invention further provides a method for application and use of the anti-reflective coating composition in combination with a photoresist on a substrate useful in manufacturing integrated circuits and micro-electronic devices. Thus in a preferred aspect, a method is provided, comprising the steps of; 1) treating a substrate with a primer, 2) applying the bottom anti-reflective composition of the present invention, 3) baking the coated bottom anti-reflective coating film to evaporate the solvent and to harden the film, 4) applying a photoresist on top of the bottom anti-reflective coating, 5) drying the photoresist, 6) exposing the photoresist using a mask, 7) developing the resist and 8) removing the bottom anti-reflective coating in the opened areas.

Other objects will become apparent from the following detailed description, preferred embodiments and illustrative examples mentioned below.

DISCLOSURE OF THE INVENTION

It was found that the objects of the invention described above were able to be attained by using an anti-reflective coating composition comprising at least a solvent and a novel polymer dye with cyclic acetal units.

That is, the present invention provides a bottom anti-reflective coating composition comprising at least a solvent and a polymer dyes as represented by general formula 1:

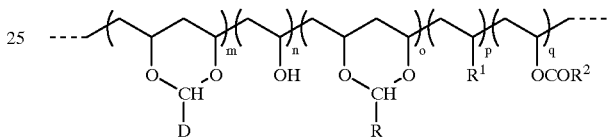

wherein

R represents a hydrogen atom, a substituted or non-substituted $C_1$–$C_{20}$ alkyl group, a substituted or non-substituted $C_6$–$C_{20}$ cycloalkyl group, or a substituted or non-substituted $C_6$–$C_{20}$ aryl group, $R^1$ represents a hydrogen atom, a substituted or non-substituted $C_1$–$C_5$ alkyl group, a substituted or non-substituted $C_1$–$C_{10}$ aryl group, or a —$COOR^3$ group in which $R^3$ represents a $C_1$–$C_{10}$ alkyl group, $R_2$ represents a substituted or non-substituted $C_1$–$C_5$ alkyl group, a substituted or non-substituted $C_6$–$C_{20}$ cycloalkyl group, or a substituted or non-substituted $C_6$–$C_{20}$ aryl group, D is an organic chromophore which absorbs at the exposure wavelength (150–450 nm) and represents a substituted or non-substituted $C_6$–$C_{30}$ aryl group, a substituted or non-substituted $C_6$–$C_{30}$ condensed aryl group, or a substituted or non-substituted $C_4$–$C_{30}$ heteroaryl group, m and o are any integer above zero, and n, p and q are any integer including zero.

Further the present invention provides a method of forming a bottom anti-reflective coating on a semiconductor substrate such as silicon wafer in which the above mentioned bottom anti-reflective coating composition is spin-coated on the substrate and baked to evaporate the solvent; and a bottom anti-reflective coating formed by the method.

Further the present invention provides a method of manufacturing an integrated circuit in which a positive-working or negative-working photoresist sensitive to radiation in the range of 150 nm-450 nm wavelength is applied onto the above mentioned bottom anti-reflective coating on the substrate, exposed to radiation, developed, and then wet or dry etched to transfer the image.

Further more the present invention provides novel polymer dyes represented by the general formula 1.

The novel polymer dyes represented by the general formula 1 are prepared by the reaction of polyvinyl alcohol or derivatives thereof and an aromatic chromophore having an aldehyde group which absorbs the radiation in the range of 150–450 nm wavelength. The film forming composition containing the polymer dye of the invention can absorb radiation in the range of 150–450 nm wavelength. It contains optionally additives such as a crosslinking agent, a thermal or photo acid generator, a plasticizer, and a surfactant. The bottom anti-reflective coating composition of the present invention is utilized for manufacturing integrated circuits due to preventing the problems caused by reflection or scattering of the radiation in lithography process.

The bottom anti-reflective coatings of the present invention are based on radiation absorbing dyes directly attached via cyclic acetal linkages to a vinyl alcohol type polymer backbone. In accordance with the present invention, the polymer dyes represented by the general formula 1 can be synthesized starting from, for example, a partially or fully hydrolyzed polyvinyl alcohol, poly(vinyl alcohol-co-ethylene), poly(vinyl acetal-co-vinyl alcohol), poly(vinyl acetal-co-vinyl alcohol-co-vinyl acetate), or partially hydrolyzed vinyl acetate-co-acrylate block copolymers and the respective chromophore-containing aldehyde compound. Reactions in synthesis examples described below proceed typically in accordance with following reaction schemes. As outlined in reaction scheme 1, polyvinyl alcohol is subjected to the parallel reaction with an aldehyde derivative R—CHO and a radiation absorbing carbonyl chromophore D—CHO. In reaction scheme 2, polyvinyl alcohol partially reacted with an aldehyde is used as the starting material and subsequently reacted with a radiation absorbing chromophore D—CHO:

Reaction scheme 1

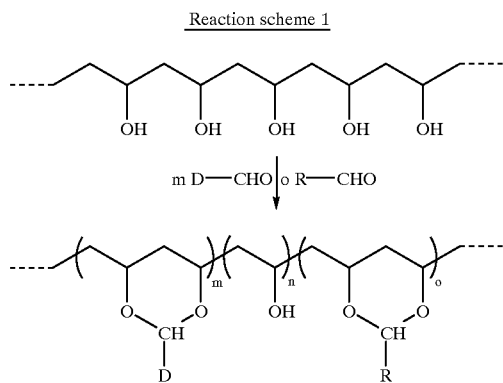

wherein

R represents a hydrogen atom, a substituted or non-substituted $C_1$–$C_{20}$ alkyl group, a substituted or non-substituted $C_6$–$C_{20}$ cycloalkyl group, or a substituted or non-substituted $C_6$–$C_{20}$ aryl group, D is an organic chromophore which absorbs at the exposure wavelength (150–450 nm) and represents a substituted or non-substituted $C_6$–$C_{30}$ aryl group, a substituted or non-substituted $C_6$–$C_{30}$ condensed aryl group, or a substituted or non-substituted $C_4$–$C_{30}$ heteroaryl group, and m, n and o are integers between 5 and 50,000.

Reaction scheme 2

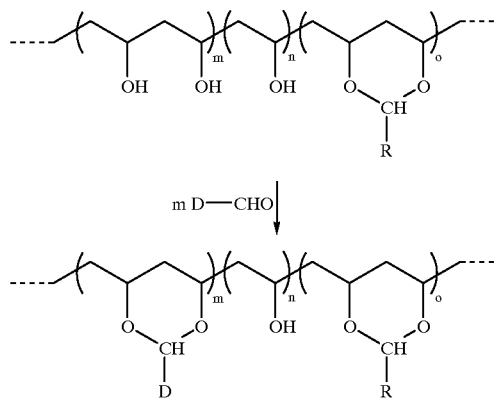

wherein

R represents a hydrogen atom, a substituted or non-substituted $C_1$–$C_{20}$ alkyl group, a substituted or non-substituted $C_6$–$C_{20}$ cycloalkyl group, or a substituted or non-substituted $C_6$–$C_{20}$ aryl group, D is an organic chromophore which absorbs at the exposure wavelength (150–450 nm) and represents a substituted or non-substituted $C_6$–$C_{30}$ aryl group, a substituted or non-substituted $C_6$–$C_{30}$ condensed aryl group, or a substituted or non-substituted $C_4$–$C_{30}$ heteroaryl group, and m, n and o are integers between 5 and 50,000.

Both reactions shown in schemes 1 and 2 are classified as acetalization reactions showing the use of aldehydes R—CHO and D—CHO, respectively, as reactants. It is well known to those skilled in the art, that either ketones (ketalization reaction) such as R—$CR^4$O and D—$CR^4$O, alkyl acetals (transacetalization reaction) such as R—CH$(OR^5)_2$ and D—CH$(OR^5)_2$, alkyl ketals (transketalization reaction) such as R—$CR^4(OR^5)_2$ and D—$CR^4(OR^5)_2$ or enolethers (wherein R and D have the same meaning as described above, $R^4$ has the same meaning as R, and $R^5$ represents a $C_1$–$C_4$ alkyl group.) may serve for the same purpose. It should be noted however, that the use of aldehydes is preferred over that of the other compounds mentioned above due to their availability and ease of reaction.

The reactions as shown in schemes 1 and 2 require acid catalysts. Any strong acid such as sulfuric acid, nitric acid or hydrochloric acid can be used. Acidic ion-exchange resins such as Amberlyst (trade name, supplied by Fluka A,G.) may also be applied as catalysts. The use of acidic ion-exchange resins has the advantage of obtaining a final product free from acidic impurities since the catalyst can be removed from the reaction mixture by filtration techniques.

The weight average molecular weight (Mw) of the polyvinyl alcohol used in reaction schemes 1 and 2 may range generally between 500 and 5,000,000. Considering the film forming properties and the solubility characteristics, preferred weight average molecular weights are between 2,000 and 100,000.

Useful radiation absorbing chromophores D include the following groups but are by no means limited to these examples: phenyl, substituted phenyl, benzyl, substituted benzyl, naphthyl, substituted naphthyl, anthracenyl, substituted anthracenyl, anthraquinonyl, substituted anthraquinonyl, acridinyl, substituted acridinyl, azophenyl, substituted azophenyl, fluorenyl, substituted fluorenyl, fluorenonyl, substituted fluorenonyl, carbazolyl, substituted carbazolyl, N-alkylcarbazolyl, dibenzofuranyl, substituted dibenzofuranyl, phenanthrenyl, substituted phenanthrenyl, pyrenyl, and substituted pyrenyl. The substitutions in the above mentioned dye molecules can include one or more of the following groups: linear, branched or cyclic $C_1$–$C_{20}$ alkyl, $C_6$–$C_{20}$ aryl, halogen, $C_1$–$C_{20}$ alkyloxy, nitro, carbonyl, cyano, amide, sulfonamide, imide, carboxylic acid, carboxylic acid ester, sulfonic acid, sulfonic acid ester, $C_1$–$C_{10}$ alkylamine, or $C_6$–$C_{20}$ arylamine.

Suitable examples of R—CHO in reaction scheme 1 include, but are not limited to formaldehyde, acetaldehyde, propionaldehyde, butylaldehyde, benzaldehyde, substituted benzaldehyde, p-hydroxybenzaldehyde, p-methoxybenzaldehyde, and the like.

The selection of the organic solvent in which the reaction between polyvinyl alcohol and the carbonyl compound is performed is not critical provided it is not basic in nature. Preferred solvents include methanol, ethanol, isopropanol, propylene glycol monomethyl ether, ethyl lactate, or glycol. Most preferred is the use of ethanol as the solvent and sulfuric acid as the acid catalyst.

The matters described hereinbefore can be applicable for partially hydrolyzed polyvinyl alcohols containing other recurrent unit except for vinyl alcohol or copolymers containing other recurrent units except for vinyl alcohol and vinyl acetate. By selection of recurrent unit except for vinyl alcohol, regulation control of solubility of polymer dye in solvent, glass transition temperature of polymer dye, melt viscosity of polymer dye, affinity of polymer dye for resist, surface unity in application, or flattening can be conducted.

Some specific examples of monomer forming other recurrent unit containing $R^1$ group include ethylene, propylene, acrylates such as methylacrylate, styrene, styrene derivatives, and the like. Examples of group $R^2$ include typically methyl, ethyl, propyl or butyl group and methyl group is preferred.

The molar ratios of the components m and o in the general formula 1 depend on the amount of D—CHO and R—CHO reacted with polyvinyl alcohol. This ratio also determines the absorption coefficient 'k' of the polymer dye as well as its solubility. It is necessary to have a sufficient amount of m in order to obtain bottom anti-reflective coating compositions capable of suppressing the standing waves. The absorption at the targeted wavelength and the refractive index of the final polymer play an important role in the applicability of the material for bottom anti-reflective coatings. Absorption values of the bottom anti-reflective coating in the range of 2 to 40 per micron film thickness is desired and values between 5 and 15 per micron are especially preferred and should be maintained in the copolymers as well. Both, too high absorption and too low absorption may lead to inferior performance of the bottom anti-reflective coating. However, there are no optimum absorption and refractive index values for a bottom anti-reflective coating material as these values also depend on the absorption and refractive index of the photoresist material applied on it. The refractive index of the bottom anti-reflective coating would be optimum if it exactly matches that of the resist layer applied on top. Although the absorption properties of the bottom anti-reflective coating are settled in substance by the molar ratio, the range of the molar ratio may be changed by the molar extinction coefficient of D. The absorption of the anti-reflective coating can be further optimized for a certain wavelength by the selection of suitable substituents on the dye functionality D. Electron withdrawing or electron donating substituents usually shift the absorption wavelength to shorter or longer wavelength, respectively. Similarly, an appropriate choice of substituents on any of the monomer units can enhance the solubility or crosslinking property of the polymer.

When the acetalization reaction is conducted by using aldehyde derivatives, R—CHO and D—CHO described hereinbefore, the uniformity of the reaction mixture is better than that of reaction system not using R—CHO. In addition, the reaction in the mixture solution proceeds at rather low temperature such as about 70° C. and fully for shorter time such as 8–10 hours and the reaction products are obtained in high yield intended. These are preferable from the standpoint of reaction mechanism and protection of chromophores. In the method of producing polymer dyes using two aldehyde derivatives of the present invention, plural chromophores can be bonded to polymer chain. One polymer bonded by plural choromophores can be applicable for two different exposure wavelength radiations. The example thereof is described in Example 7 mentioned below, wherein a polymer dye absorbing at wavelength radiations of both 248 nm KrF laser and 193 nm ArF laser is used. This is clearly different from the technique described in JP-A H10-221855 which does not use aldehyde derivative, R—CHO in production of polymer dyes and is one of main distinctive points of the present invention.

Molar ratios of the components n, p and q in the general formula 1 are any integer containing zero and these values are selected suitably accordance with the properties required to the polymer dye. For example either p or q may be zero or both p and q may be zero.

The preferred examples of the range of these m, n, o, p and q are, m=0.20–0.90, n=0.05–0.30, o=0.01–0.40, p=0–0.40, and q =0.01–0.20.

The solubility of the bottom anti-reflective coating materials in safe solvents is an important criterion. The solvent should be capable to dissolve the polymer dye material and other additives (surfactants, plasticizers, crosslinking agents) to improve the bottom anti-reflective coating film formation properties. From the standpoint of safety, solubility, evaporation ability and film formation, examples of preferred solvents include, but are not limited to propylene glycol monomethyl ether acetate (PGMEA), ethyl lactate (EL), propylene glycol monomethyl ether, cyclohexanone, cyclopentanone, 2-heptanone and combinations thereof. The solubility of the polymer dye represented by general formula 1 of the present invention itself can be controlled by proper selection of suitable coreactants R—CHO as depicted in reaction schemes 1 and 2.

Apart from the polymer dye and the solvent the bottom anti-reflective coating composition of the present invention may also contain surfactants, crosslinking agents, acid generators, and other additives to enhance the performance of the coating, and to form a uniform, defect free film on the semiconductor substrate. As examples of surfactants, fluorinated or siloxane-based compounds can be used but are not limited to these groups of compounds. The crosslinking agents can be either thermal crosslinking agents such as blocked isocyanates, acid catalyzed crosslinking agents such as the melamine or uracil resins, or epoxy-based crosslinking agents. The acid generators can also be either thermal acid generators or photo acid generators.

Another important and desired property of bottom anti-reflective coatings is their high etch rates in plasmas and this property is mainly controlled by the selection of the polymer dye used in the bottom anti-reflective coating material. It is well known in skilled artists in the semiconductor industry that a bottom anti-reflective coating material having significantly higher etch rate than the resist itself in order to successfully transfer the pattern after exposure and further processing steps.

The etch rate of an organic material can be calculated by using the Ohnishi number or the carbon/hydrogen ratio of the polymer. Since the polymer materials represented by the general formula 1 contain a high oxygen content and aliphatic carbon moieties, these compounds exhibit high Ohnishi numbers and are anticipated to have high etch rates. This is another merit of this kind of polymer dyes when used as a bottom anti-reflective coating material.

The glass transition temperature of the bottom anti-reflective coating material plays an important role with respect to substrate coverage and intermixing properties between the bottom anti-reflective coating layer and the applied photoresist. While a relative low glass transition temperature is preferred to achieve good step coverage, a higher glass transition point is preferred with regard to non-intermixing properties between the bottom anti-reflective coating and photoresist layer. Since the photoresist is applied onto the bottom anti-reflective coating layer, exposed and developed, any mixing between the alkali-insoluble bottom anti-reflective coating layer and the alkali-soluble photoresist would lead to incomplete removal of the photoresist material upon development usually performed with alkaline developers. Another problem to encounter is that when a chemically amplified photoresist material is applied on a bottom anti-reflective coating with low glass transition temperature the acid formed upon exposure might diffuse into the bottom anti-reflective coating layer leading to a distortion of the latent acid image and causing incomplete removal of the photoresist material upon development. Therefore, it is desirable that the bottom anti-reflective coating material has a glass transition temperature at least above the maximum processing temperatures used while applying the photoresist. This can be controlled in the present invention by manipulating the molar ratio of m, n and o.

The polymer dye content in the anti-reflective coating composition is preferably in the range of about 1 wt % to about 30 wt %. Preferred concentration is definitely dependent on the molecular weight of the dye polymer and the film thickness required to the bottom anti-reflective coating. The anti-reflective coating is applied on the substrate using techniques well known to those skilled in the art, such as dipping, spin coating, roller coating or spraying. The preferred film thickness of the anti-reflective coating ranges from 30 nm to 1000 nm.

The process of the present invention further comprises coating a substrate with the bottom anti-reflective coating of the present invention and heating on a hotplate or convection oven at a sufficiently high temperature for a sufficient length of time to remove the solvent in the coating and to crosslink the polymer to a sufficient extent so as not to be soluble in the coating solvent of the photoresist or in the alkaline developer. The preferred ranges of temperature and time upon baking are from about 70° C. to about 280° C. and for 30 seconds to 30 minutes. If the temperature is below 70° C. the residual amount of solvent is too high or the degree of crosslinking is insufficient. At temperatures above 280° C. the polymer may become chemically unstable.

The bottom anti-reflective coating is coated on top of the substrate and is further subject to heating and dry etching. It is envisioned that the bottom anti-reflective coating is of sufficiently low metal ion content so that the electrical properties of the semiconductor device are not adversely affected. Treatments such as passing a solution of the polymer through an ion exchange column, filtration and extraction can be used to reduce the concentrations of metal ions or particles.

In the present invention integrated circuits are produced by the way that positive- or negative-working photoresist sensitive to radiation in the range of 150 nm–450 nm wavelength is applied onto the bottom anti-reflective coating layer formed by applying the bottom anti-reflective coating composition of the present invention on the substrate. After this, the resist layer on the substrate is subjected to exposure and development, and then the image is transferred by wet or dry etching followed by processing necessary for forming the integrated circuit.

The bottom anti-reflective coating materials of the present invention can be preferably applied for both positive- and negative-working resist materials. The preferred photoresists include but are by no means limited to these examples, one comprising a novolak resin and a photosensitizer such as quinondiazide and one comprising a substituted polyhydroxystyrene and a photo active agent.

BEST MODE FOR CARRYING OUT THE INVENTION

The bottom anti-reflective coating composition of the present invention, the method of manufacturing the composition and the manner of using the composition are described in more detail by way of following Application Example and Examples but these examples are only illustrative and not intended to limit or restrict the scope of the invention in any way and should not be construed as providing conditions, parameters or values which must be utilized exclusively in order to practice the present invention.

APPLICATION EXAMPLE

The following general method was used to evaluate the bottom anti-reflective coating compositions of the present invention unless specified otherwise:

A 2 wt % solution of the bottom anti-reflective coating material in an appropriate solvent was filtered using 0.5 and 0.2 micron filters, and spin-coated on a 4-inch silicon wafer at a suitable spin speed for 40 seconds in such a way that the bottom anti-reflective coating composition has a film thickness of 60 nm after baking at 200° C. for 60 seconds. The film was checked with a high resolution microscope to identify surface defects. The values of the optical constants n (refractive index) and k (absorption parameter) of the film were measured on a ellipsometer at the respective wavelengths (248 nm or 356 nm).

Then a positive- or negative-working, acid-catalyzed deep UV photoresist (film thickness approximately 700 nm) or a positive- or negative-working i-line novolak resist (film thickness approximately 1000 nm) was applied on the bottom anti-reflective coating by spin-coating at a suitable spin speed for 40 seconds. Depending on the resist material, the resists were soft baked for 60 seconds at 90–110° C. and exposed on a stepper operating with an excimer laser (248 nm) source in the case of the deep UV resists or an i-line (356 nm) stepper in the case of the i-line resist using a reticle with line and space patterns. Following the exposure, the deep UV resists were subjected to a post-exposure bake at 90–110° C. The photoresists were developed using a 0.26 N tetramethyl ammonium hydroxide developer solution for 60 seconds at 23° C. to form the resist patterns. The resist patterns were examined on a scanning electron microscopy to check the resolution, standing wave formation, reflective notching, and footing. In order to evaluate the step-coverage properties of the bottom anti-reflective coating materials, a silicon substrate was first coated with a conventional i-line photoresist at a film thickness of 1000 nm, imagewise exposed, developed and hard-baked at 200° C. Then the bottom anti-reflective coating material was coated on the processed wafer having 1000 nm steps provided by the imaged photoresist. The step-coverage of the bottom anti-reflective coating then was analyzed by a scanning electron microscopy. The etch rates of the bottom anti-reflective coating materials were evaluated using oxygen and fluoride gas plasmas.

Example 1

Synthesis of a polymer dye starting from polyvinyl alcohol (PVA), anthracene-9-aldehyde (9-AA) and propionaldehyde (PA) and application thereof as a bottom anti-reflective coating 22.0 g (0.5 mol) of polyvinyl alcohol (supplied from Wako Pure Chemical, degree of polymerization DP=500), 150 g of ethanol, 25.78 g (0.125 mol) of anthracene-9-aldehyde, 7.26 g (0.125 mol) of propionaldehyde, 0.15 g of 2,6-di-t-butyl-4-methylphenol and 0.25 g of concentrated sulfuric acid were charged into a 300 ml flask. With stirring, the mixture was heated at 70° C. for 8 hours under nitrogen atmosphere. The resulting mixture was cooled and the precipitated solid was filtered, dissolved in tetrahydrofuran (THF), and precipitated from THF in water twice. The resulting yellow powder was dried at 40° C. under vacuum (1 torr). The k value of the polymer as measured on an ellipsometer at 248 nm was found to be 0.4. The polymer was dissolved in cyclohexanone (2 wt % solids), filtered and applied as bottom anti-reflective coating as described in Application Example. A positive-working deep UV resist AZ® DX 1100 available from Clariant (Japan) K.K., was spin-coated, and softbaked at 110° C. to yield a film thickness of 755 nm and then exposed using a deep UV stepper (Nikon EX-1OB) attached with a 248 nm KrF laser at a dose of 52 mJ/cm$^2$. The exposed wafer was baked at 90° C. for 60 seconds, developed using paddle development for 60 seconds at 23° C., rinsed and dried.

Scanning electron microscope inspection of the line and space patterns revealed that no standing waves are noticed due to the suppression of reflected light from the substrate by the polymer dye. The resist line pattern profiles were found to be vertical, and the spaces were almost clear showing neither scum nor residues. An etch rate of the bottom anti-reflective coating using an oxygen and trifluoromethane gas plasma at 60 W was found to be 100 nm/minute.

Examples 2

The procedure of Example 1 was repeated except that positive-working deep Uv photoresist AZ® DX 1200P available from Clariant (Japan) K.K. was used as deep UV photoresist and prebake 90° C., film thickness 970 nm, dose 28 mJ/cm$^2$, and post exposure bake 105° C. were adapted as process conditions.

The resulting pattern showed neither footing of the lines nor scum in the spaces, and their profiles were smooth due to the absence of standing waves.

Example 3

The procedure of Example 1 was repeated except that positive-working deep UV photoresist AZ® DX 1300P available from Clariant (Japan) K.K. was used as deep UV photoresist and prebake 90° C., film thickness 715 nm, dose 13 mJ/cm$^2$, and post exposure bake 110° C. were adapted as process conditions.

The resulting pattern showed neither footing of the lines nor scum in the spaces, and their profiles were smooth due to the absence of standing waves.

Example 4

Synthesis of a polymer dye starting from polyvinyl alcohol, anthracene-9-aldehyde and propionaldehyde and application thereof as a bottom anti-reflective coating 22.0 g (0.5 mol) of polyvinyl alcohol (supplied from Wako Pure Chemical Co., degree of polymerization 500), 150 g of ethanol, 25.78 g (0.125 mol) of anthracene-9-aldehyde, 7.26 g (0.125 mol) of propionaldehyde, 0.15 g of 2,6-di-t-butyl-4-methylphenol and 1.20 g of Amberlyst 15 (acidic type ion-exchange resin from Fluka A.G., catalyst) were charged into a 300 ml flask. The mixture was stirred and heated at 70° C. for 8 hours under nitrogen atmosphere. After the solution was cooled to room temperature, the solid phase was filtered off and dissolved in tetrahydrofuran (THF). The insoluble portion consisting mainly of Amberlyst 15 was removed and the THF solution was twice precipitated from THF in water. The polymer dye was dried at 40° C. under vacuum (1 torr). The k value of the polymer as measured on an ellipsometer at 248 nm was found to be 0.39. The polymer was dissolved in cyclohexanone (2 wt % solids), filtered and coated as a bottom-anti-reflective coating as described in Application Example. A positive-working deep UV resist AZ® DX 1100 available from Clariant (Japan) K.K. was spin-coated and processed as described in Example 1.

The obtained line and space patterns were found to be free from standing wave. The pattern profiles were found to be straight, and the space were found to be clear with no scum or residues. An etch rate of the bottom anti-reflective coating using oxygen and trifluoromethane gas plasma at 60 W was found to be 100 nm/minute.

Examples 5

The procedure of Example 4 was repeated except that positive-working deep UV photoresist AZ® DX 2034P available from Clariant (Japan) K.K. was used as deep UV resist and prebake 90° C., film thickness 570 nm, dose 34 mJ/cm$^2$, and post-exposure bake 105° C. were adapted as process conditions.

The resulting pattern showed neither footing of the lines nor scum in the spaces, and their profiles were smooth due to the absence of standing waves. The resolution of the deep UV photoresist AZ® DX 2034P on this bottom anti-reflective coating was better than 0.20 μm.

Example 6

The procedure of Example 4 was repeated except that positive-working deep UV photoresist APEX® E avilable from Shipley Corp. was used as deep UV resist and prebake 90° C., film thickness 725 nm, dose 11 mJ/cm$^2$, and post-exposure bake 110° C. were adapted as process conditions.

The resulting pattern showed neither footing of the lines nor scum in the spaces, and their profiles were smooth due to the absence of standing waves.

Example 7

Synthesis of a polymer dye starting from polyvinyl alcohol, anthracene-9-aldehyde and 4-hydroxybenzaldehyde (4-HBA) and application thereof as a bottom anti-reflective coating 22.0 g (0.5 mol) of polyvinyl alcohol (supplied from Wako Pure Chemical Co., degree of polymerization 500), 150 g of ethanol, 25.78 g (0.125 mol) of anthracene-9-aldehyde, 13.43 g (0.125 mol) of 4-hydroxybenzaldhyde, 0.15 g of 2,6-di-t-butyl-4-methylphenol and 0.25 g of concentrated sulfuric acid were charged into a 300 ml flask. The mixture was stirred and heated at 70° C. for 8 hours under nitrogen atmosphere. The solution was cooled to room temperature, the solid phase was filtered off and was dissolved in tetrahydrofuran (THF). Insoluble portions were removed and the THF solution was precipitated from THF twice in water. The product was dried at 40° C. under vacuum (1 torr). The k value of the polymer as measured on an ellipsometer at 248 nm was found to be 0.32. The polymer was dissolved in cyclohexanone (2 wt % solids), filtered and coated as bottom anti-reflective coating as described in Application Example. A positive-working deep UV resist AZ® DX 1100 available from Clariant (Japan) K.K. was spin-coated on the bottom anti-reflective coating and processed as described in Example 1.

The bottom anti-reflective coating used in this Example is applicable not only for exposure with 248 nm KrF laser but also for that with 193 nm ArF laser. The k value of the polymer as measured on an ellipsometer at 193 nm was found to be 0.32.

The obtained line and space patterns were found to be free from standing waves due to the suppression of reflected light from the substrate. The pattern profiles were found to be straight, and the spaces were found to be clear with neither scum nor residues. An etch rate of the bottom anti-reflective coating using oxygen and trifluoromethane gas plasma at 60 W was found to be 90 nm/minute.

Examples 8

The procedure of Example 7 was repeated except that negative-working deep UV photoresist TDUR® N9 available from Tokyo Ohka K. K. was used in place of deep UV resist AZ® DX1100 and prebake 100° C., film thickness 730 nm, dose 44 mJ/cm$^2$, and post-exposure bake 130° C. were adapted as process conditions.

Example 9

The procedure of Example 7 was repeated except that positive-working deep UV photoresist UVIII® available from Shipley Corp. was used in place of deep UV resist AZ® DX1100 and prebake 130° C., film thickness 625 nm, dose 21 mJ/cm$^2$, and post-exposure bake 130° C. were adapted as process conditions.

Example 10

The procedure of Example 7 was repeated except that positive-working i-line and deep UV photoresist AZ® PR1024 available from Clariant Corp. was used in place of deep UV resist AZ® DX1100 and prebake 90° C., film thickness 350 nm, dose of deep UV 32 mJ/cm$^2$, and no post-exposure bake were adapted as process conditions.

All resulting patterns in Examples 8, 9 and 10 showed neither footing of the lines nor scum in the spaces, and their profiles were smooth due to the absence of standing waves.

Example 11

Synthesis of a polymer dye starting from 80% hydrolyzed polyvinyl alcohol, anthracene-9-aldehyde and propionaldehyde and application thereof as a bottom anti-reflective coating 25 g of polyvinyl alcohol (supplied from Aldrich A.G., weight average molecular weight Mw=9,000–10, 000 and hydrolysis degree 80%), 150 g of ethanol, 25.78 g (0.125 mol) of anthracene-9-aldehyde, 7.26 g (0.125 mol) of propionaldehyde, 0.15 g of 2,6-di-t-butyl-4-methylphenol and 0.25 g of concentrated sulfuric acid were charged into a 300 ml flask. The mixture was stirred and heated at 70° C. for 8 hours under nitrogen atmosphere. After the solution was cooled, it was diluted with ethanol. The solid phase was filtered off and dissolved in THF. The THF solution was twice precipitated in water. The polymer dye obtained was dried at 40° C. under vacuum (1 torr). The k value of the polymer as measured on an ellipsometer at 248 nm was found to be 0.35. The polymer was dissolved in ethyl lactate (2 wt % solids), filtered and coated as a bottom-anti-reflective coating as described in Application Example. A positive-working deep UV resist AZ® DX 1100 available from Clariant (Japan) K.K. was spin-coated and processed as described in Example 1. The resulting pattern showed neither standing wave in the lines nor scum or residues in the spaces.

Example 12

Negative-working deep UV resist with following constitution was applied on the bottom anti-reflective coating described in Example 11.

| (constitution) | (part by weight) |
|---|---|
| 4-hydroxystyrene/styrene (8/2) copolymer (weight average molecular weight 12,000) | 80 |
| hexamethoxymethylmeramine (distilled) | 20 |
| tribromomethylphenylsulfone | 1 |
| tributyl amine | 0.1 |

The resist applied on the substrate was soft-baked for 60 seconds at 110° C., exposed at dose of 24 mJ/cm$^2$, post-exposed at 120° C. for 60 seconds and processed as described in Example 1. Under these conditions some scum (footing) in the unexposed areas was observed. Therefore, a 5 wt % Kronate® thermal crosslinking agent (available from Nippon Polyurethane K. K.) was added to the bottom anti-reflective coating solution described in Example 11 and the resultant composition was used in place of the bottom anti-reflective coating composition described in Example 11 and processed as described above. This time, the line and space patterns were found to be free from standing waves. The pattern profiles were found to be straight and the space was found to be clear with no scum.

An etch rate of the bottom anti-reflective coating using oxygen and trifluoromethane gas plasma at 60 W was found to be 105 nm/minute. Example 13: Synthesis of a polymer dye starting from poly(vinyl alcohol-co-ethylene) [PVA-ET], anthracene-9-aldehyde and propionaldehyde and application thereof as a bottom anti-reflective coating 22 g of poly(vinyl alcohol-co-ethylene) (obtained from Aldrich Co., ethylene content 27 mol %), 150 g of o-xylene, 25.78 g (0.125 mol) of anthracene-9-aldehyde, 3.6 g (0.063 mol) of propionaldehyde, 0.15 g of 2,6-di-t-butyl-4-methylphenol and 0.25 g of concentrated sulfuric acid were charged into a 300 ml flask. The mixture was stirred and heated at 120° C. for 8 hours under nitrogen atmosphere. The solution was cooled, diluted, and filtered. The viscous solution obtained was twice precipitated in a 70:30 v/v ethanol:water mixture. The polymer was dried at 40° C. under vacuum (1 torr). The k value of the polymer as measured on an ellipsometer at 248 nm was found to be 0.38. The polymer was dissolved in ethyl lactate (2 wt % solids), filtered and doated as bottom-anti-reflective coating as described in the general application example. A positive-working deep UV resist AZ® DX 1100 available from Clariant (Japan) K.K. was spin-coated on the bottom anti-reflective coating and processed as described in Example 1.

The obtained line and space patterns were found to be free from standing waves due to suppression of reflected light from the substrate. The pattern profiles were found to be straight and the space was found to be clear with no scum or residues.

Similar results were obtained with the positive-working deep UV photoresist AZ® DX 2034 as well as a negative-working resist described in Example 12. An etch rate of the bottom anti-reflective coating material using oxygen and trifluoromethane gas plasma at 60 W was found to be 90 nm/minute.

Comparative Example 1

Synthesis of a polymer dye starting from polyvinyl alcohol and anthracene-9-aldehyde and application thereof as a bottom anti-reflective coating 22.0 g (0.5 mol) of polyvinyl alcohol (supplied from Wako Pure Chemical Co., degree of polymerization 500), 150 g of ethanol, 25.78 g (0.125 mol) of anthracene-9-aldehyde, 0.15 g 2,6-di-t-butyl-4-methylphenol and 0.25 g of concentrated sulfuric acid were charged into a 300 ml flask. The mixture was stirred and heated at 70° C. for 8 hours under nitrogen atmosphere. The resulting mixture was cooled and the precipitated solid was filtered and dissolved in tetrahydrofuran (THF). Small amount of insoluble portion was removed and the THF solution was precipitated from THF in water twice. The resulting yellow powder was dried at 40° C. under vacuum (1 torr). The k value of the polymer as measured on an ellipsometer at 248 nm was found to be 0.42. The polymer was dissolved in cyclohexanone (2 wt % solids), filtered and coated as bottom anti-reflective coating as described in Application Example. A positive-working deep UV resist AZ® DX 1100 available from Clariant (Japan) K. K. was spin-coated on the anti-reflective coating and processed as described in Example 1.

In the line and space patterns no standing waves was observed due to the suppression of reflected light from the substrate. The resist pattern profiles were found to be vertical, and the spaces were clear showing neither scum nor residues. An etch rate of the bottom anti-reflective coating using an oxygen and trifluoromethane gas plasma at 60 W was found to be 105 nm/minute.

Comparative Example 2

The procedure of Comparative Example 1 was repeated except that polyvinyl alcohol (supplied from Wako Pure Chemical Co., degree of polymerization 1000) was used in the synthesis in place of polyvinyl alcohol (supplied from Wako Pure Chemical Co., degree of polymerization 500).

Comparative Example 3

The procedure of Comparative Example 1 was repeated except that partially hydrolyzed polyvinyl alcohol (supplied from Wako Pure Chemical Co., degree of polymerization 1000) was used in the synthesis in place of polyvinyl alcohol (supplied from Wako Pure Chemical Co., degree of polymerization 500).

Comparative Example 4

The procedure of Comparative Example 1 was repeated except that partially hydrolyzed polyvinyl alcohol (supplied from Wako Pure Chemical Co., degree of polymerization 2800) was used in the synthesis in place of polyvinyl alcohol (supplied from Wako Pure Chemical Co., degree of polymerization 500).

Comparative Example 5

The procedure of Comparative Example 1 was repeated except that partially hydrolyzed polyvinyl alcohol (supplied from Wako Pure Chemical Co., degree of polymerization 3500) was used in the synthesis in place of polyvinyl alcohol (supplied from Wako Pure Chemical Co., degree of polymerization 500).

In all cases of Comparative Examples 2 to 5 neither footing of the lines nor scum in the spaces were observed, and the photoresist profiles were smooth due to the absence of standing waves. However, it was found that the step coverage properties became inferior in proportion to the increase of degree of polymerization. As the result, it was seen that the polymer dye formed using higher degree of polymerization polymer showed a tendency of inferior film formation along the stepped surface.

Yields of acetalization reactions in Examples 1, 4, 7, 11 and 13 and Comparative Examples 1 to 5 are shown in following table 1.

TABLE 1

| | Backbone polymer | D-CHO | R-CHO | Reaction temperature (° C.) | Reaction time (hour) | Yield* (%) | Special mention |
|---|---|---|---|---|---|---|---|
| Example 1 | PVA DP = 500 | 9-AA | PA | 70 | 8 | 116 | |
| Example 4 | PVA DP = 500 | 9-AA | PA | 70 | 8 | 132 | |
| Example 7 | PVA DP = 500 | 9-AA | 4-HBA | 70 | 8 | 126 | |
| Example 11 | PVA Mw = 9000~10000 80% hydrolyzed | 9-AA | PA | 70 | 8 | 118 | |
| Example 13 | PVA-Et (Et = 27 mol %) | 9-AA | PA | 120 | 8 | 128 | |
| Comparative Example 1 | PVA DP = 500 | 9-AA | — | 70 | 8 | 60 | Separation of solid phase and liquid phase was difficult |
| Comparative Example 2 | PVA DP = 1000 | 9-AA | — | 70 | 8 | 78 | Separation of solid phase and liquid phase was difficult |
| Comparative Example 3 | PVA DP = 1000 Partially saponified | 9-AA | — | 70 | 8 | 100 | Separation of solid phase and liquid phase was difficult |
| Comparative Example 4 | PVA DP = 2800 Partially saponified | 9-AA | — | 70 | 8 | 82 | Separation of solid phase and liquid phase was difficult |

TABLE 1-continued

| | Backbone polymer | D-CHO | R-CHO | Reaction temperature (° C.) | Reaction time (hour) | Yield* (%) | Special mention |
|---|---|---|---|---|---|---|---|
| Comparative Example 5 | PVA DP = 3500 Partially saponified | 9-AA | — | 70 | 8 | 80 | Separation of solid phase and liquid phase was difficult |

*wt % based on weight of charged PVA

It is clearly understood from table 1 that the yield of reaction product using both an alkyl or benzaldehyde derivative and anthracene-9-aldehyde is higher than that using only anthracene-9-aldehyde.

Effect of the Invention

In the present invention solvents used in formation of the photoresist layer can be utilized as a solvent of the bottom anti-reflective coating composition, and the bottom anti-reflective coating composition of the present invention has good storage stability, excellent film formation properties and excellent step coverage properties. In addition, since the bottom anti-reflective coating formed by using the bottom anti-reflective coating composition of the present invention reveals high absorption at exposure wavelength radiation, there is no problem of standing wave formation or reflective notching as well as intermixing between the photoresist layer and the bottom anti-reflective coating. Further the bottom anti-reflective coating of the present invention has high etch rate. Therefore fine resist patterns with high resolution and good pattern shape can be formed by using the bottom anti-reflective coating composition of the present invention and integrated circuits having desirable degree of integration can be manufactured with ease by processing the semiconductor substrate with the fine resist patterns.

Industrial applicability

As has been described hereinbefore, the novel polymer dyes of the present invention can be used as bottom anti-reflective coating materials and by use of the bottom anti-reflective coating composition comprising the novel polymer dye, integrated circuits with high degree of integration can be formed easily and in high yield.

What is claimed is:

1. A bottom anti-reflective coating composition for use in photolithography which comprises at least a solvent and a polymer dye represented by general formula 1:

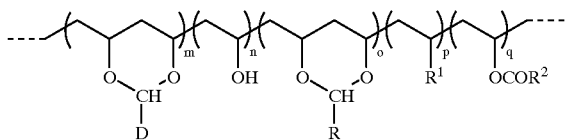

wherein
R represents a hydrogen atom, a substituted or non-substituted $C_1$–$C_{20}$ alkyl group, a substituted or non-substituted $C_6$–$C_{20}$ cycloalkyl group, or a substituted or non-substituted $C_6$–$C_{20}$ aryl group,
$R^1$ represents a hydrogen atom, a substituted or non-substituted $C_1$–$C_5$ alkyl group, a substituted or non-substituted $C_6$–$C_{10}$ aryl group, or a —$COOR^3$ group in which $R^3$ represents a $C_1$–$C_{10}$ alkyl group,
$R^2$ represents a substituted or non-substituted $C_1$–$C_5$ alkyl group, a substituted or non-substituted $C_6$–$C_{20}$ cycloalkyl group, or a substituted or non-substituted $C_6$–$C_{20}$ aryl group, D is an organic chromophore which absorbs at the exposure wavelength (150–450 nm) and represents a substituted or non-substituted $C_6$–$C_{30}$ aryl group, a substituted or non-substituted $C_6$–$C_{30}$ condensed aryl group, or a substituted or non-substituted $C_4$–$C_{30}$ heteroaryl group,
m and o are any integer above zero, and
n, p and q are any integer including zero.

2. The bottom anti-reflective coating composition according to claim 1 wherein D represents phenyl, substituted phenyl, benzyl, substituted benzyl, naphthyl, substituted naphthyl, anthracenyl, substituted anthracenyl, anthraquinonyl, substituted anthraquinonyl, acridinyl, substituted acridinyl, azophenyl, substituted azophenyl, fluorenyl, substituted fluorenyl, fluorenonyl, substituted fluorenonyl, carbazolyl, substituted carbazolyl, N-alkylcarbazolyl, dibenzofuranyl, substituted dibenzofuranyl, phenanthrenyl, substituted phenanthrenyl, pyrenyl, or substituted pyrenyl, and the substitution is optionally selected from one or more of the following groups; linear, branched or cyclic $C_1$–$C_{20}$ alkyl, $C_6$–$C_{20}$ aryl, halogen, $C_1$–$C_{20}$ alkyloxy, nitro, carbonyl, cyano, amide, sulfonamide, imide, carboxylic acid, carboxylic acid ester, sulfonic acid, sulfonic acid ester, $C_1$–$C_{10}$ alkylamine, or $C_6$–$C_{20}$ arylamine.

3. The bottom anti-reflective coating composition according to claim 1 wherein R represents either hydrogen, methyl, ethyl, propyl, butyl, nitrophenyl, hydroxyphenyl, or methoxyphenyl.

4. The bottom anti-reflective coating composition according to claim 1 wherein $R^2$ represents methyl, ethyl, propyl, phenyl, naphthyl, or anthracenyl.

5. The bottom ant-reflective coating composition according to claim 1 wherein D represents substituted or non-substituted phenyl, naphthyl or anthracenyl.

6. The bottom anti-reflective coating composition according to claim 5 wherein p is zero.

7. The bottom anti-reflective coating composition according to claim 1 wherein the polymer dye represented by the general formula 1 has a weight average molecular weight (Mw) between 2,000 to 200,000.

8. The bottom anti-reflective coating composition according to claim 1 wherein 50 to 95 parts by weight of the solids are the polymer dye represented in the general formula 1 and 50 to 5 parts by weight are a thermal crosslinking agent.

9. The bottom anti-reflective coating composition according to claim 8 wherein the crosslinking agent is either melamine, blocked isocyanate, uracil, or epoxy type crosslinking agent.

10. The bottom anti-reflective coating composition according to claim 1 wherein 50 to 95 parts by weight of the solids are the polymer dye represented by the general formula 1, 50 to 5 parts by weight are a thermal crosslinking agent and 1 to 10 parts by weight of solids are an acid generator.

11. The bottom anti-reflective coating composition according to claim 10 wherein the crosslinking agent is either melamine, blocked isocyanate, uracil, or epoxy type crosslinking agent and the acid generator is either an onium salt, a diazomethane compound or a nitrobenzyl tosylate.

12. The bottom anti-reflective coating composition according to claim 1 wherein the polymer dye represented by the general formula 1 are dissolved in 1 to 10 wt % concentration in cyclohexanone, propylene glycol monomethyl ether acetate, ethyl lactate, methyl amyl ketone, or a mixture of these solvents.

13. A method of producing an anti-reflective coating on a semiconductor substrate which comprises the following steps:
   a) dissolving at least the polymer dye represented by the general formula 1 described in claim 1 in an organic solvent,
   b) filtering the solution and then spin-, spray-, dip-, or roller-coating the solution onto a semiconductor substrate, and
   c) thermally removing the solvent to form a substrate coated with a bottom anti-reflective coating composition described in claim 1.

14. A method of manufacturing integrated circuits in which a positive- or negative-working photoresist sensitive to radiation in the range of 150 nm to 450 nm is applied on a semiconductor substrate coated with a thin layer of a bottom anti-reflective coating composition of claim 1, and the resist coated substrate is exposed with radiation, developed, and etched by dry or wet etching process to transferred the image on to the substrate.

15. The method of manufacturing integrated circuits according to claim 14 wherein the photoresist comprises a novolak resin, a photosensitive compound and a solvent.

16. The method of manufacturing integrated circuits according to claim 14 wherein the photoresist comprises a substituted polyhydroxystyrene, a photo-active compound and a solvent.

17. A polymer dye represented by general formula 1:

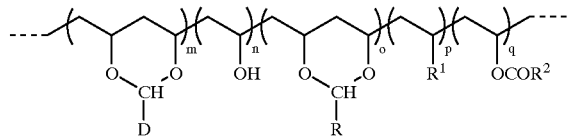

wherein

R represents a hydrogen atom, a substituted or non-substituted $C_1$–$C_{20}$ alkyl group, a substituted or non-substituted $C_6$–$C_{20}$ cycloalkyl group, or a substituted or non-substituted $C_6$–$C_{20}$ aryl group, $R^1$ represents a hydrogen atom, a substituted or non-substituted $C_1$–$C_5$ alkyl group, a substituted or non-substituted $C_6$–$C_1$ aryl group, or a —$COOR^3$ group in which $R^3$ represents a $C_1$–$C_{10}$ alkyl group, $R^2$ represents a substituted or non-substituted $C_1$–$C_5$ alkyl group, a substituted or non-substituted $C_6$–$C_{20}$ cycloalkyl group, or a substituted or non-substituted $C_6$–$C_{20}$ aryl group, D is an organic chromophore which absorbs at the exposure wavelength (150–450 nm) and represents a substituted or non-substituted $C_6$–$C_{30}$ aryl group, a substituted or non-substituted $C_6$–$C_{30}$ condensed aryl group, or a substituted or non-substituted $C_4$–$C_{30}$ heteroaryl group, m and o are any integer above zero, and n, p and q are any integer including zero.

18. A method of producing the polymer dye represented by the general formula 1 described in claim 17.

* * * * *